United States Patent [19]

Iizuka et al.

[11] Patent Number: 4,551,195
[45] Date of Patent: Nov. 5, 1985

[54] METHOD FOR GROWING BORON NITRIDE CRYSTALS OF CUBIC SYSTEM

[75] Inventors: Eiichi Iizuka; Tomoji Sando; Shinji Kashima; Masakazu Maki, all of Shiojiri, Japan

[73] Assignee: Showa Denko Kabushiki Kaisha, Tokyo, Japan

[21] Appl. No.: 654,293

[22] Filed: Sep. 25, 1984

[51] Int. Cl.⁴ ............................................... C30B 29/38
[52] U.S. Cl. ........................... 156/603; 156/DIG. 98; 156/DIG. 99; 423/290
[58] Field of Search ....... 156/603, DIG. 99, DIG. 98; 423/290

[56] References Cited

U.S. PATENT DOCUMENTS

| | | | |
|---|---|---|---|
| 3,192,015 | 6/1965 | Wentorf, Jr. | 156/603 |
| 3,423,177 | 1/1969 | Bovenkerk | 156/603 |
| 4,150,098 | 4/1979 | Sirota et al. | 423/290 |
| 4,287,264 | 9/1981 | Endo et al. | 423/290 |
| 4,469,802 | 9/1984 | Endo et al. | 423/290 |

Primary Examiner—William F. Smith
Attorney, Agent, or Firm—Armstrong, Nikaido, Marmelstein & Kubovcik

[57] ABSTRACT

Cubic boron nitride crystals are grown by subjecting reaction materials of low pressure phase boron nitride, a solvent material, and cubic boron nitride seeds to pressure and temperature conditions in the cubic boron nitride-stable region. The reaction materials are in the form of a pair of a superimposed solvent material plate and a low pressure phase boron nitride plate or a pile made of a plurality of the pairs of the superimposed solvent material plate and low pressure phase boron nitride plate, and a plurality of the seeds are disposed on either one or each of the confronting surfaces of the pair of the superimposed solvent material plate and low pressure phase boron nitride plate. Alternatively, the reaction materials are in the form of a plate made of a mixture of the solvent material and the low pressure phase boron nitride or a pile made of a plurality of the mixture plates, and a plurality of the seeds are disposed on a surface of each plate. The seeds have a particle size of not larger than 150 μm and are regularly disposed in such a manner that the seeds are located at a substantially equal distance and the distance between the peripheries of every two adjacent grown cubic boron nitride crystal particles is from 20 to 200 μm. The cubic boron nitride crystals are allowed to grow until their sizes reach at least 1.5 times the size of the seeds.

7 Claims, 3 Drawing Figures

METHOD FOR GROWING BORON NITRIDE CRYSTALS OF CUBIC SYSTEM

BACKGROUND OF THE INVENTION

(1) Field of the Invention

The present invention relates to a method for synthesizing boron nitride of the cubic system (CBN) at a high temperature under a high pressure, wherein boron nitride crystals of the cubic system are grown by using their particles as seeds.

(2) Description of the Prior Art

When boron nitride of the cubic system is synthesized according to the hydrostatic pressure method, to obtain crystals having a low inclusion content and a good shape, it is important to grow the crystals at temperatures and pressures very close to the phase equilibrium line. Accordingly, the use of granular seeds is considered effective for controlling the number of nuclei acting as the centers of growth of the crystals.

In synthesizing boron nitride of the cubic system according to the hydrostatic pressure method, a temperature difference growth method and a film growth method are adopted as means for growing the crystals. According to the former method, a seed and a starting material source are made present and a solvent material having a temperature gradient is interposed therebetween in such a manner that the seed is positioned on the low temperature side of the solvent material, where a cubic boron nitride crystal is grown. According to the latter method, low pressure phase boron nitride (i.e., boron nitride of the hexagonal system) is dissolved in a thin film of a solvent material adhering to the periphery of a boron nitride seed particle of the cubic system, and a boron nitride crystal of the cubic system is grown by utilizing the solubility difference between the low pressure phase boron nitride of the hexagonal system and the boron nitride of the cubic system. In the latter method, the crystal size depends principally on the time necessary for the synthesis, the amount of cubic nuclei generated, and the amount of starting boron nitride supplied. If seeds are used for the generation of nuclei, the number of nuclei can be controlled, but because of irregular distribution of the nuclei, deviations of the nucleus-growing time among various points in the sample, and interference among nuclei or growing particles, it is difficult to obtain boron nitride crystals of the cubic system with a uniform particle size in a high yield.

Even if the number of nuclei can be controlled by using seeds, when crystals are grown in a region where the degree of supersaturation of the boron nitride concentration is high, good quality crystals cannot be obtained and the crystal shape is unsatisfactory. Furthermore, the amounts of included impurities such as the solvent material, starting material, and bubbles are increased. In order to reduce the degree of supersaturation, it is necessary to maintain the temperature and pressure conditions in close proximity to the phase equilibrium line. However, in an industrial super-high pressure synthesis apparatus, it is very difficult to regularly measure the temperature and pressure in the reaction zone and to control them to the intended values.

A method is known in which a solvent material and a starting boron nitride are mixed with seeds, the mixture is molded into columns, and the columns are charged in a high pressure apparatus where boron nitride crystals of the cubic system are grown. However, since it is difficult to disperse the seeds uniformly in the mixture, deviations are readily caused in the growth of the crystals.

SUMMARY OF THE INVENTION

Under the above background, it is the primary object of the present invention to provide a method in which boron nitride crystals of the cubic system having a narrow particle size distribution and high mechanical strengths such as crushing strength can be obtained with a high productivity.

More specifically, in accordance with the present invention, there is provided an improvement in a method for growing boron nitride crystals of the cubic system which comprises, subjecting reaction materials of low pressure phase boron nitride, a solvent material, and boron nitride particles of the cubic system as the seeds, to pressure and temperature conditions in the region in which boron nitride of the cubic system is stable, wherein the reaction materials are in the form of a pair of a superimposed solvent material plate and a low pressure phase boron nitride plate or a pile made of a plurality of those pairs of superimposed solvent material plates and low pressure phase boron nitride plates, a plurality of the boron nitride particles of the cubic system being disposed on either one or each of the confronting surfaces of the pair of the superimposed solvent material plate and low pressure phase boron nitride plate; or the reaction materials are in the form of a plate made of a mixture of the solvent material and the low pressure phase boron nitride or a pile made of a plurality of the solvent material/low pressure phase boron nitride mixture plates, a plurality of the boron nitride particles of the cubic system being disposed on a surface of each solvent material/low pressure phase boron nitride mixture plate. The improvement comprises regularly disposing the boron nitride seed particles having a particle size of not larger than 150 $\mu$m in such a manner that the seed particles are located at a substantially equal distance and the distance between the peripheries of every two adjacent grown boron nitride crystal particles is in the range of 20 to 200 $\mu$m; and allowing the boron nitride crystals of the cubic system to grow until their sizes reach at least 1.5 times the size of the seed particles.

DESCRIPTION OF THE PREFERRED EMBODIMENTS

Figure 1:
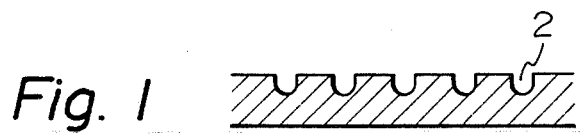
FIG. 1 is a sectional view of part of a plate of a solvent material, on which a plurality of holes for placing seeds therein are made.

In the method of the present invention, cubic boron nitride crystal seed particles are regularly disposed on either one or each of a superimposed solvent material plate and a low pressure phase boron nitride plate, or on a plate of a solvent material/low pressure phase boron nitride mixture plate, so that the seed particles are located at a substantially equal distance and the distance between the peripheries of every two adjacent grown boron nitride crystal particles is within the predetermined range.

Various methods may be adopted for regularly disposing cubic boron nitride crystal seed particles. A preferable method comprises placing the seed particles one by one in a plurality of holes made on a plate. The holes may be made on a solvent material plate, a low pressure phase boron nitride plate, or a solvent material/low pressure phase boron nitride mixture plate by using mechanical means such as a small diameter drill. In the case of solvent material plates made of a metal, holes can be made by not only mechanical means but also by an etching method including photoetching, a discharge method, or a laser processing method.

Placing of the seed particles in the holes may be accomplished by scattering the particles on a plate in which holes are made, and appropriately vibrating the plate. For this placing, it is preferred that the seed particles be covered with an electrically conductive substance, more preferably, plated with a metal. The seed particles are rounded to some extent and made antistatic by the metal plating, whereby they can be readily placed in the holes. The metal used for plating is preferably the same as the solvent material when the solvent material is a metal.

Furthermore, covering of the seed particles with a metal or a compound is advantageous in that there is no risk of direct contact of the seed particles with low pressure phase boron nitride under crystal growth conditions, where the seed particles are disposed on a low pressure phase boron nitride plate. The metal used for this purpose may or may not be the same as the metal used as the solvent material. The materials that can be used for covering the seed particles include, for example, an alkali metal, an alkaline earth metal, an element selected from Groups III and IV of the periodic table, or a nitride thereof.

When bare seed particles are placed in the holes made in the solvent material plate, it is preferred that the openings of the holes are ordinarily closed by a metal sheet after the disposition of the seed particles.

Through-holes may be formed instead of the above-mentioned holes, but from the viewpoint of handling ease, non-through-holes are preferable to through-holes.

As an alternative to the above-mentioned method, in which holes are made and seed particles are placed therein, a method may be adopted in which seed particles are directly pressed into the plate. In addition, where the plates on which the seed particles are placed are made of a metal, a minor amount of an adhesive material may be spot-coated on the surfaces of the plates, instead of making holes therein, and bare or metal-coated seed particles may be bonded to the surfaces. Thus, the seed-bonded metal plates and low pressure phase boron nitride plates are superimposed alternately to form a pile wherein the seed particles are disposed regularly on the interface between each low pressure phase boron nitride plate and each metal plate. Regular disposition of the seed particles may be accomplished by using a net having appropriate apertures or an electronic part automatic disposition apparatus.

Figure 2:
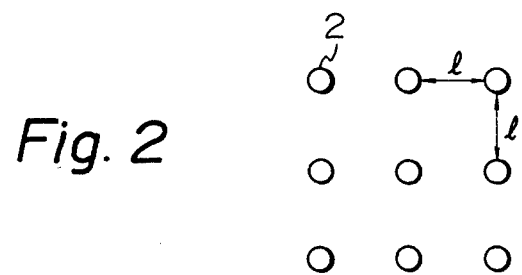
FIG. 2 is a plane view of part of the plate shown in FIG. 1.

FIG. 1 shows the state where a plurality of holes 2 for disposing seed particles therein are made in a solvent material plate 1. FIG. 2 shows the state where the plurality of holes 2 are regularly disposed in such a manner that distances 1 between the peripheries of every two adjacent holes 2 are substantially equal and in a predetermined range such as will provide a distance of from 20 to 200 $\mu$m between the peripheries of every two adjacent grown cubic boron nitride crystal particles. The disposition of the holes 2 is not limited to the checkered pattern disposition shown in FIG. 2, but any layout pattern may be adopted so far as the distances between every two adjacent holes are substantially equal.

Figure 3:
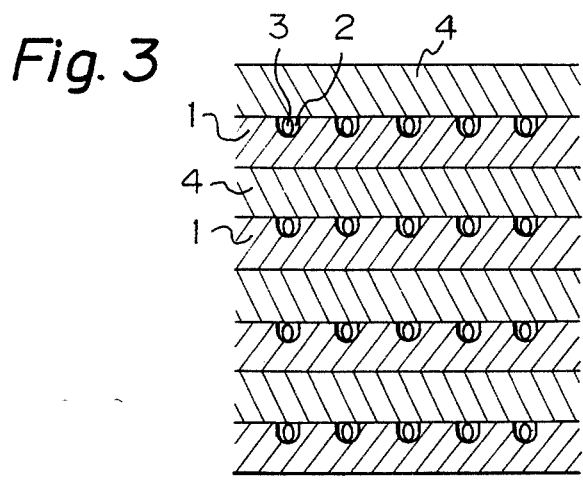
FIG. 3 is a sectional view showing the state where many of the solvent material plates shown in FIG. 1 and low pressure phase boron nitride plates are superimposed alternately.

The solvent material plate 1 having holes 2, in which cubic boron nitride seed particles are placed, is superimposed on a low pressure phase boron nitride plate so that the seed particle-disposed surface of the solvent material plate 1 confronts the low pressure phase boron nitride plate. Such a pair of the superimposed solvent material plate and the low pressure phase boron nitride plate may be subjected, as is, to pressure and temperature conditions in the cubic boron nitride crystal-stable region. Alternatively, as shown in FIG. 3, a pile is made of a plurality of such pairs of the superimposed solvent material plate and the low pressure phase boron nitride plate 4, and the pile is subjected to the desired pressure and temperature conditions in the cubic boron nitride crystal-stable region.

Cubic boron nitride seed particles may be disposed not on a solvent material plate but on a low pressure phase boron nitride plate or on both a solvent material plate and low pressure phase boron nitride plate. Alternatively, the seed particles may be disposed on a plate made by compression-molding a mixture of a solvent material powder and a low pressure phase boron nitride powder by using, for example, a hot press.

It is essential that cubic boron nitride seed particles are regularly disposed in such a manner that the seed particles are located at a substantially equal distance and the distance between the peripheries of every two adjacent grown cubic boron nitride crystal paticles is in the range of 20 to 200 $\mu$m. If the distance between the peripheries of every two adjacent grown cubic boron nitride crystal particles is smaller than 20 $\mu$m, the adjacent particles interfere with one another in the course of the crystal growth, with the result that the growing cubic boron nitride crystals adhere to each other or the growth is impeded and the obtained crystals have a broad particle size distribution and are of poor quality. If the aforesaid distance exceeds 200 $\mu$m, the degree of supersaturation becomes non-uniform and deviations are readily caused in the growth of the crystals, and consequently the diamond crystals tend to have a broad particle size distribution. In addition, productivity is poor.

It is also essential that cubic boron nitride seed particles having a particle size of not larger than 150 $\mu$m are used, and that the cubic boron nitride crystals are allowed to grow until their sizes (particle diameters) reach at least 1.5 times the size (particle diameters) of the seed particles. By using seed particles of such a small particle size, cubic boron nitride crystals of a high quality, particularly with an enhanced crushing strength and other mechanical strengths, can be obtained. If seed particles having a particle size larger than 150 $\mu$m are used, it is difficult to cover the seed particles uniformly with a catalyst film. It is preferable to use seed particles having a particle size of 10 to 120 $\mu$m. The growth ratio is usually in the range of from 1.5 to 10 times, more preferably approximately 3 to 5 times, in the particle diameter.

As the solvent material, there can be used alkali metals such as lithium, alkaline earth metals such as calcium and magnesium, nitrides thereof such as $Li_3N$ and $Ca_3N_2$, and composite nitrides such as $LiCaBN_2$ and $Li_3BN_2$.

To avoid an excessively high growth speed of the crystals and to obtain crystals having a good shape, a minor amount of Si, Mo, Zr, Ti, Al, Sn, Pt, Pb, B or C, or a silicide, boride or nitride thereof may be added into the starting reaction materials.

The pressure and temperature conditions in the cubic boron nitride stable-region, under which the cubic boron nitride crystals are allowed to grow, involve usually a temperature of from 1250° to 1850° C. and a pressure of from 45 to 70 Kbar. The crystal growth period is usually from about 10 to about 60 minutes.

In the above-mentioned reaction system, if the number of seed particles is determined in such a manner that the total growth amount of the cubic boron nitride crystal expected to be formed by the reaction is in agreement with the product of the desired average growth amount per seed particle and the number of seed particles, the aimed particle size distribution of cubic boron nitride can be narrowed. To systematically determine the total growth amount of the cubic boron nitride expected to be formed, it is better to carry out synthesis of the cubic boron nitride under various final loads and determine the growth amounts. If the final load is increased within a range allowable for the synthesis apparatus, the amount of cubic boron nitride formed can be increased. However, if the seed density is too high, the grown particles interfere with one another. As a means for effectively narrowing the particle size distribution, there can be mentioned a method in which the distances of the adjacent seeds in the horizontal and vertical directions and the particle size of seeds are varied while taking the temperature or pressure distribution in the reaction zone into consideration.

The present invention will now be described in detail with reference to the following examples that by no means limit the scope of the invention.

EXAMPLE 1

Discs having a diameter of 26 mm and a thickness of 1.4 mm were molded from boron nitride of the hexagonal system. In each of the discs of boron nitride of the hexagonal system, holes having a diameter of 0.15 mm and a depth of 0.25 mm were made at crossing points of a checkered pattern having intervals of 0.4 mm, and particles of boron nitride of the cubic system having a size of 90 to 110 $\mu$m were placed in these holes. These discs and discs molded from lithium calcium boron nitride having a diameter of 26 mm and a thickness of 1.5 mm were alternately superimposed upon one another in a cylindrical heater of graphite having an outer diameter of 28.6 mm, an inner diameter of 26 mm, and a length of 38 mm, to form a pile. Both the upper and lower ends of the pile were covered with agalmatolite sheets to attain a heat-insulating effect, and iron lids were capped thereon. The assembly was placed in a belt type superhigh pressure synthesis apparatus. The pile was compressed and electricity was applied to the heater to indirectly heat the pile. The reaction conditions were such that the pressure was about 57 Kbar and the temperature was about 1450° C. The reaction time was 15 minutes.

As the result, about 6 g of boron nitride of the cubic system was obtained, the particle size of which was concentrated to the range of 250 to 300 $\mu$m in about 40% of the obtained crystals. The yield of brown transparent blocky crystals of good shape and quality was 80%, that is, two times the yield (about 40%) obtained by the conventional method in which a molded article obtained from a mixture of the same amounts of seeds, a hexagonal boron nitride powder and a $LiCaBN_2$ powder was used.

EXAMPLE 2

In the same graphite cylinder as that used in Example 1, discs molded from hexagonal boron nitride and having a diameter of 26 mm and a thickness of 1.5 mm, and discs molded from $Ca_3B_2N_4$ and having a diameter of 26 mm and a thickness of 1.5 mm, were alternately superimposed one upon another as reaction materials. A thin copper (catalyst) disc having a diameter of 26 mm and a thickness of 0.3 mm was placed between each adjacent hexagonal boron nitride disc and $Ca_3B_2N_4$ disc. In each of the copper discs, holes having a diameter of 0.1 mm were previously made at crossing points of a checkered pattern having intervals of 0.4 mm, and a cubic boron nitride seed particle having a size of 60 to 80 $\mu$m was previously placed in each hole. Each hole was a through-hole extending from one surface to the other surface, wherein the hole opening in one surface had a diameter smaller than the hole opening in the other surface. Both the upper and lower ends of the pile were covered with agalmatolite sheets to attain a heatinsulating effect, and were capped with iron lids. The assembly was placed in a belt type super-high pressure synthesis apparatus. The pile was compressed and electricity was applied to the graphite cylinder to indirectly heat the pile. The reaction conditions were as follows. First, the pressure was raised to 50 Kbar and the temperature elevated to 1500° C. The pressure was then gradually raised to 57 Kbar over a period of 20 minutes. The results were similar to those obtained in Example 1.

EXAMPLE 3

Cubic boron nitride crystals were grown in the same manner as described in Example 2 except that thin magnesium (catalyst) discs having a diameter of 26 mm and a thickness of 0.3 mm were used instead of the thin copper discs, and holes having a diameter of 0.2 were made at crossing points of a checkered pattern having intervals of 0.5 mm. The seed particles used were cubic boron nitride particles having a particle size of 30 to 40 $\mu$m, which was coated with copper to a particle size of 100 to 120 $\mu$m. The reaction conditions were as follows. First, the pressure was raised to 50 Kbar and the temperature elevated to 1500° C. The pressure was then gradually raised to 57 Kbar over a period of 40 minutes. The results were similar to those obtained in Example 1.

COMPARATIVE EXAMPLE 1

Cubic boron nitride crystals were grown in the same manner as described in Example 1 except that holes having a diameter of 0.5 mm were made at crossing points of a checkered pattern having intervals of 0.9 mm in each copper disc, and cubic boron nitride seed particles having a size of 300 to 350 $\mu$m were placed in the holes. The reaction conditions were the same as those employed in Example 2. The yield of the grown crystals was 6 gr. The predominant part of the grown crystals had a size of 700 to 800 $\mu$m. The grown crystals were not uniform and almost no blocky crystals of good shape and quality were obtained.

We claim:

1. An improvement in a method for growing boron nitride crystals of the cubic system which comprises subjecting reaction materials of low pressure phase boron nitride, a solvent material, and cubic boron nitride particles as the seeds, to pressure and temperature conditions in the cubic boron nitride-stable region, wherein the reaction materials are in the form of a pair of a superimposed solvent material plate and a low pressure phase boron nitride plate or a pile made of a plurality of said pairs of the superimposed solvent material plate and low pressure phase boron nitride plate, a plurality of the seed particles being disposed on either one or each of the confronting surfaces of the pair of the superimposed solvent material plate and low pressure phase boron nitride plate; or the reaction materials are in the form of a plate made of a mixture of the solvent material and the low pressure phase boron nitride or a pile made of a plurality of the solvent material/low pressure phase boron nitride mixture plates, a plurality of the seed particles being disposed on a surface of each solvent material/low pressure phase boron nitride mixture plate, said improvement comprising regularly disposing the seed particles having a particle size of not larger than 150 μm in such a manner that the seed particles are located at a substantially equal distance and the distance between the peripheries of every two adjacent grown cubic boron nitride crystal particles is in the range of 20 to 200 μm; and allowing the cubic boron nitride crystals to grow until their sizes reach at least 1.5 times the size of the seed particles.

2. A method according to claim 1, wherein the seed particles are placed one by one in a plurality of holes made in either one or each of the confronting surfaces of the pair of the superimposed solvent material plate and low pressure phase boron nitride plate, said holes being made at a substantially equal distance and at a distance such as will provide a distance of 20 to 200 μm between the peripheries of every two adjacent grown cubic boron nitride crystal particles.

3. A method according to claim 2, wherein the plurality of holes are made in the solvent material plate.

4. A method according to claim 2, wherein the seed particles are plated with a metal.

5. A method according to claim 1, wherein the seed particles have a particle size of from 10 to 120 μm.

6. A method according to claim 1, wherein the cubic boron nitride crystals are allowed to grow until their sizes reach 1.5 to 10 times the size of the seed particles.

7. A method according to claim 1, wherein the solvent material is selected from the group consisting of alkali metals, alkaline earth metals, nitrides of alkali or alkaline earth metals, and composite nitrides of alkali or alkaline earth metals.

* * * * *